(12) United States Patent
Mihara et al.

(10) Patent No.: US 6,677,871 B2
(45) Date of Patent: Jan. 13, 2004

(54) ANALOG SIGNAL CONVERTER AND MOBILE COMMUNICATION SYSTEM USING THE SAME

(75) Inventors: Nobukazu Mihara, Chiba (JP); Izumi Hayashibara, Chiba (JP)

(73) Assignee: Kawasaki Microelectronics, Inc., Chiba (JP)

( * ) Notice: Subject to any disclaimer, the term of this patent is extended or adjusted under 35 U.S.C. 154(b) by 0 days.

(21) Appl. No.: 10/319,527

(22) Filed: Dec. 16, 2002

(65) Prior Publication Data

US 2003/0112162 A1 Jun. 19, 2003

(30) Foreign Application Priority Data

Dec. 17, 2001 (JP) .................................... 2001-383142

(51) Int. Cl.[7] .............................................. H03M 1/00
(52) U.S. Cl. ....................................... 341/110; 341/118
(58) Field of Search ................................. 341/110, 140, 341/150, 118, 144, 155

(56) References Cited

U.S. PATENT DOCUMENTS 4,862,168 A * 8/1989 Beard .......................... 341/140
6,118,399 A * 9/2000 Krone ......................... 341/150

* cited by examiner

Primary Examiner—Brian Young
(74) Attorney, Agent, or Firm—Oliff & Berridge, PLC

(57) ABSTRACT

An encoding circuit sequentially encodes digital signals supplied in time series from a digital signal source and then transfers the encoded signals. A decoding circuit sequentially receives the encoded digital signals transferred from the encoding circuit and then decodes the signals. A digital-analog converter sequentially converts the digital signals decoded by the decoding circuit into analog signals. Thus, power consumed when the digital signal output from the digital circuitry is transferred to the analog circuitry is reduced.

5 Claims, 11 Drawing Sheets

FIG. 3

| OUTPUT SIGNAL (BINARY NUMBER) OF DIGITAL FILTER | (DECIMAL NUMBER) | DIFFERENCE | OUTPUT SIGNAL (BINARY NUMBER) OF ENCODING CIRCUIT |
|---|---|---|---|
| 1101001011 | 843 |  | = 1111111011 |
| 1100110110 | 822 | −21 | = 1111110100 |
| 1011110110 | 758 | −64 | = 1111101000 |
| 1010011010 | 666 | −92 | = 1111001100 |
| 1000111001 | 569 |  | = 1000111001 |

FIG. 4A

| BIT OF DATA TO BE TRANSFERRED | NUMBER OF TRANSITION TIMES |
|---|---|
| Bit[9] | 28816 |
| Bit[8] | 54153 |
| Bit[7] | 82626 |
| Bit[6] | 85206 |
| Bit[5] | 78288 |
| Bit[4] | 76826 |
| Bit[3] | 76329 |
| Bit[2] | 76661 |
| Bit[1] | 76945 |
| Bit[0] | 76944 |
| TOTAL IN ALL BITS | 712794 |

FIG. 4B

| BIT OF DATA TO BE TRANSFERRED | NUMBER OF TRANSITION TIMES |
|---|---|
| Bit[9] | 52070 |
| Bit[8] | 44910 |
| Bit[7] | 50666 |
| Bit[6] | 80932 |
| Bit[5] | 73427 |
| Bit[4] | 73564 |
| Bit[3] | 74951 |
| Bit[2] | 76944 |
| Bit[1] | 76783 |
| Bit[0] | 76057 |
| TOTAL IN ALL BITS | 680304 |

FIG. 6A

|  | INPUT | DIFFERENCE | SECOND DIFFERENCE |
|---|---|---|---|
| 3RD PREVIOUS |  |  |  |
| 2ND PREVIOUS |  |  |  |
| 1ST PREVIOUS |  |  |  |
| PRESENT | A |  |  |

FIG. 6B

|  | INPUT | DIFFERENCE | SECOND DIFFERENCE |
|---|---|---|---|
| 3RD PREVIOUS |  |  |  |
| 2ND PREVIOUS |  |  |  |
| 1ST PREVIOUS | A |  |  |
| PRESENT | B |  |  |

FIG. 6C

|  | INPUT | DIFFERENCE | SECOND DIFFERENCE |
|---|---|---|---|
| 3RD PREVIOUS |  |  |  |
| 2ND PREVIOUS | A |  |  |
| 1ST PREVIOUS | B |  |  |
| PRESENT | C | B−A |  |

FIG. 6D

|  | INPUT | DIFFERENCE | SECOND DIFFERENCE |
|---|---|---|---|
| 3RD PREVIOUS | A |  |  |
| 2ND PREVIOUS | B |  |  |
| 1ST PREVIOUS | C | B−A |  |
| PRESENT | D | C−B |  |

FIG. 6E

|  | INPUT | DIFFERENCE | SECOND DIFFERENCE |
|---|---|---|---|
| 3RD PREVIOUS | B | | |
| 2ND PREVIOUS | C | B-A | |
| 1ST PREVIOUS | D | C-B | |
| PRESENT | E | D-C | (C-B)-(B-A) |

FIG. 6F

|  | INPUT | DIFFERENCE | SECOND DIFFERENCE |
|---|---|---|---|
| 3RD PREVIOUS | C | | |
| 2ND PREVIOUS | D | C-B | |
| 1ST PREVIOUS | E | D-C | (C-B)-(B-A) |
| PRESENT | F | E-D | (D-C)-(C-B) |

FIG. 6G

|  | INPUT | DIFFERENCE | SECOND DIFFERENCE |
|---|---|---|---|
| 3RD PREVIOUS | D | | |
| 2ND PREVIOUS | E | D-C | |
| 1ST PREVIOUS | F | E-D | (D-C)-(C-B) |
| PRESENT | A' | F-E | (E-D)-(D-C) |

FIG. 6H

|  | INPUT | DIFFERENCE | SECOND DIFFERENCE |
|---|---|---|---|
| 3RD PREVIOUS | E | | |
| 2ND PREVIOUS | F | E-D | |
| 1ST PREVIOUS | A' | F-E | (E-D)-(D-C) |
| PRESENT | B' | A'-F | (F-E)-(E-D) |

FIG. 6I

| | INPUT | DIFFERENCE | SECOND DIFFERENCE |
|---|---|---|---|
| 3RD PREVIOUS | F | | |
| 2ND PREVIOUS | A' | F−E | |
| 1ST PREVIOUS | B' | A'−F | (F−E)−(E−D) |
| PRESENT | C' | B'−A' | (A'−F)−(F−E) |

FIG. 6J

| | INPUT | DIFFERENCE | SECOND DIFFERENCE |
|---|---|---|---|
| 3RD PREVIOUS | A' | | |
| 2ND PREVIOUS | B' | A'−F | |
| 1ST PREVIOUS | C' | B'−A' | (A'−F)−(F−E) |
| PRESENT | D' | C'−B' | (B'−A')−(A'−F) |

FIG. 6K

| | INPUT | DIFFERENCE | SECOND DIFFERENCE |
|---|---|---|---|
| 3RD PREVIOUS | B' | | |
| 2ND PREVIOUS | C' | B'−A' | |
| 1ST PREVIOUS | D' | C'−B' | (B'−A')−(A'−F) |
| PRESENT | E' | D'−C' | (C'−B')−(B'−A') |

FIG. 6L

| | INPUT | DIFFERENCE | SECOND DIFFERENCE |
|---|---|---|---|
| 3RD PREVIOUS | C' | | |
| 2ND PREVIOUS | D' | C'−B' | |
| 1ST PREVIOUS | E' | D'−C' | (C'−B')−(B'−A') |
| PRESENT | F' | E'−D' | (D'−C')−(C'−B') |

FIG. 7

| No. | mem1 (RECEIVED DATA) | mem2 | mem3 | DECODED DATA |
|---|---|---|---|---|
| 1 | 0 | 0 | 0 | A |
| 2 | (B−A) | 0 | A | B=(B−A)+0+A |
| 3 | (C−B)−(B−A) | (B−A) | B | C=((C−B)−(B−A))+(B−A)+B |
| 4 | (D−C)−(C−B) | (C−B) | C | D=((D−C)−(C−B))+(C−B)+C |

FIG. 8

| INPUT DATA | DIFFERENTIAL DATA | SECOND DIFFERENTIAL DATA |
|---|---|---|
| 512 | | |
| 502 | −10 | |
| 473 | −29 | −19 |
| 425 | −48 | −19 |
| 362 | −63 | −15 |
| 284 | −78 | −15 |
| 195 | −89 | −11 |
| 99 | −96 | −7 |
| 0 | | |

FIG. 9

| No. | mem1 (RECEIVED DATA) | mem2 | mem3 | DECODED DATA |
|---|---|---|---|---|
| 1 | 0 | 0 | 0 | 512 |
| 2 | −10 | 0 | 512 | 502 |
| 3 | −19 | −10 | 502 | 473 |
| 4 | −19 | −29 | 473 | 425 |
| 5 | −15 | −48 | 425 | 362 |
| 6 | −15 | −63 | 362 | 284 |
| 7 | −11 | −78 | 284 | 195 |
| 8 | −7 | −89 | 195 | 99 |
| 9 | 0 | 0 | 0 | 0 |

FIG. 10

| | DATA TO BE ENCODED | ENCODED DATA |
|---|---|---|
| Bit[9] | 4 TIMES | 6 TIMES |
| Bit[8] | 8 TIMES | 2 TIMES |
| Bit[7] | 16 TIMES | 4 TIMES |
| Bit[6] | 20 TIMES | 2 TIMES |
| Bit[5] | 20 TIMES | 4 TIMES |
| Bit[4] | 16 TIMES | 10 TIMES |
| Bit[3] | 12 TIMES | 14 TIMES |
| Bit[2] | 16 TIMES | 22 TIMES |
| Bit[1] | 20 TIMES | 8 TIMES |
| Bit[0] | 16 TIMES | 8 TIMES |
| TOTAL IN ALL BITS | 148 TIMES | 80 TIMES |

ANALOG SIGNAL CONVERTER AND MOBILE COMMUNICATION SYSTEM USING THE SAME

The disclosure of Japanese Patent Application No. 2001-383142 filed on Dec. 17, 2001 including the specification, drawings and Abstract are incorporated herein by reference in its entirety.

BACKGROUND OF THE INVENTION

1. Field of Invention

The present invention relates to an analog signal converter for converting digital signals supplied from a signal source into analog signals, and a mobile communication system using the analog signal converter.

2. Description of Related Art

In digital communication systems such as a code division multiple access (CDMA) system, a time division multiple access (TDMA) system, and a frequency division multiple access (FDMA) system, a digital signal is modulated and the modulated digital signal is then converted into an analog signal as an output signal of baseband circuits at the baseband final stage. Particularly, in the CDMA system which requires high-precision modulation, as shown in FIG. 11, it is well-known that a digital filter 14 is used and digital signals are converted into analog signals with oversampling techniques (for example, IS-95, 3GPP (W-CDMA) or the like).

When an analog signal converter 40 shown in FIG. 11 is used in the mobile communication system, for example, cellular phones, signals to be transmitted are modulated into signals within a frequency band used in radio communication by a digital modulator 12. Signals of a predetermined frequency band are extracted through the digital filter 14. The signals are supplied to a digital-analog converter (DAC) 20 through signal lines D and are then sampled using sampling clock CK. The sampled digital signals are converted into analog signals. The converted analog signals are then supplied to a radio-frequency (RF) circuit through a smoothing filter 22.

In the analog signal converter 40 shown in FIG. 11, the DAC 20 and the smoothing filter 22 located on the right side are analog circuits. The digital modulator 12 and the digital filter 14 on the left side are digital circuits. Therefore, the analog and digital circuits are generally designed as different functional blocks. The analog block is connected to the digital block by the signal lines D for transferring digital signals and a signal line for transferring sampling clock CK to sample the digital signals supplied to the DAC 20 through the signal lines D.

If the analog signal converter 40 is composed of an LSI chip mounting the DAC 20 and the smoothing filter 22 and an LSI chip mounting the digital modulator 12 and the digital filter 14, the power consumption in driving the signal lines D which connect both the blocks is not negligible. Where both the functional blocks are mounted on the same LSI chip, if they are arranged at a long distance from each other in the chip, similarly, the power consumption in driving the signal lines D is not negligible.

For example, in case of two LSIs, when it is assumed that a frequency of the sampling clock CK is 16 MHz, the amplitude of each signal line D is 3 V and 20 signal lines D exist in total, and the capacitance per signal line is 20 pF, power consumed by wiring capacitances of the signal lines amounts to about 14 mW. When it is assumed that power consumed by an output driver of the digital filter is about 30 mW, the total power consumption is about 44 mW. Thus, the analog signal converter disadvantageously consumes considerable power in the mobile communication.

SUMMARY OF THE INVENTION

Accordingly, it is an object of the present invention to overcome the above-mentioned disadvantages of the related arts. It is an object of the present invention to provide an analog signal converter which can reduce power consumed at the time when digital signals output from a digital circuit are transferred to an analog circuit and a mobile communication system using the analog-signal converter.

According to the present invention, an analog signal converter including an encoding circuit that sequentially encodes digital signals supplied in time series, a decoding circuit that sequentially decodes the digital signals encoded by the encoding circuit and a digital-analog converter that sequentially converts the digital signals decoded by the decoding circuit into analog signals.

Preferably, the encoding circuit obtains a difference between adjacent digital signals supplied in time series.

Preferably, the encoding circuit obtains a difference between adjacent digital signals supplied in time series and further obtains a difference between the differences.

Preferably, the encoding circuit does not encode one digital signal of the digital signals supplied in time series every predetermined number of digital signals and outputs the digital signal as is.

Preferably, the encoding circuit does not encode a digital signal at a time just prior to a positive or negative of the difference being inverted and outputs the digital signal as is.

According to the present invention, an analog signal converter for converting digital signals into analog signals has digital circuitry and analog circuitry and includes a digital modulator that modulates digital signals into modulated digital signals in a predetermined frequency band used in communication, a digital filter that extracts filtered digital signals in the predetermined frequency band from the modulated digital signals and an encoding circuit that sequentially encodes the filtered digital signals output from the digital filter. Moreover, the converter includes a decoding circuit that sequentially decodes the encoded digital signals and a digital-analog converter that sequentially converts the decoded digital signals into analog signals.

Preferably, the encoding circuit performs encoding by using sampling clock, or clock synchronously to the sampling clock, so as to sample the decoded digital signals in the digital-analog converter.

Preferably, the decoding circuit performs decoding by using sampling clock, or clock synchronously to the sampling clock, so as to sample the decoded digital signals in the digital-analog converter.

Preferably, the encoding circuit includes a memory for sequentially storing digital signals output from the digital filter, and a circuit for obtaining a difference between one digital signal and the next digital signal.

Preferably, the decoding circuit includes a memory for storing encoded digital signals, and a circuit for adding one encoded digital signal and the next encoded digital signal.

According to the present invention, there is provided a mobile communication system using an analog signal converter for sequentially encoding digital signals supplied in time series, sequentially decoding the encoded digital signals, and sequentially converting the decoded digital signals into analog signals.

BRIEF DESCRIPTION OF THE DRAWINGS

FIG. 3 is an exemplary schematic diagram showing signals to be encoded and encoded signals according to the present embodiment.

FIGS. 4A–B are exemplary tables according to the present embodiment, showing the number of transition times of signals to be encoded and that of encoded signals.

FIGS. 6A–L are exemplary conceptual diagrams showing the operation of the encoding circuit according to the present embodiment.

FIG. 7 is an exemplary table showing the operation of the decoding circuit according to the present embodiment.

FIG. 8 is an exemplary table showing input data, differential data, and second differential data according to the present embodiment.

FIG. 9 is an exemplary table showing the operation of the decoding circuit according to the present embodiment when the data shown in FIG. 8 is used.

FIG. 10 is an exemplary table showing the number of transition times of data to be encoded and that of encoded data according to the present embodiment.

DETAILED DESCRIPTION OF PREFERRED EMBODIMENTS

An analog signal converter according to an exemplary embodiment of the present invention will now be described in detail herein below with reference to the drawings.

Figure 1:
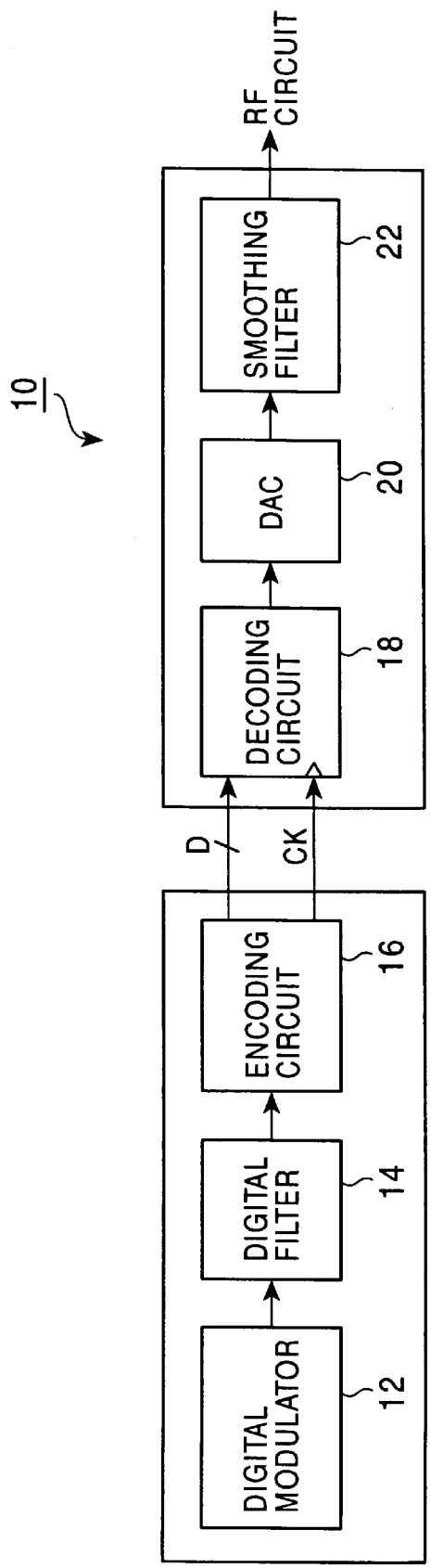
FIG. 1 is an exemplary block diagram showing an embodiment of an analog signal converter according to the present invention.

FIG. 1 is an exemplary block diagram of the present embodiment of the analog signal converter according to the present invention.

Referring to FIG. 1, an analog signal converter 10 converts digital signals transferred from a signal source into analog signals. The left part in FIG. 1 corresponds to digital circuitry serving as a signal source of digital signals. The right part corresponds to analog circuitry for converting the digital signals transferred from the digital circuitry into analog signals. The digital circuitry includes a digital modulator 12, a digital filter 14, and an encoding circuit 16. The analog circuitry includes a decoding circuit 18, a DAC 20, and a smoothing filter 22.

Figure 11:
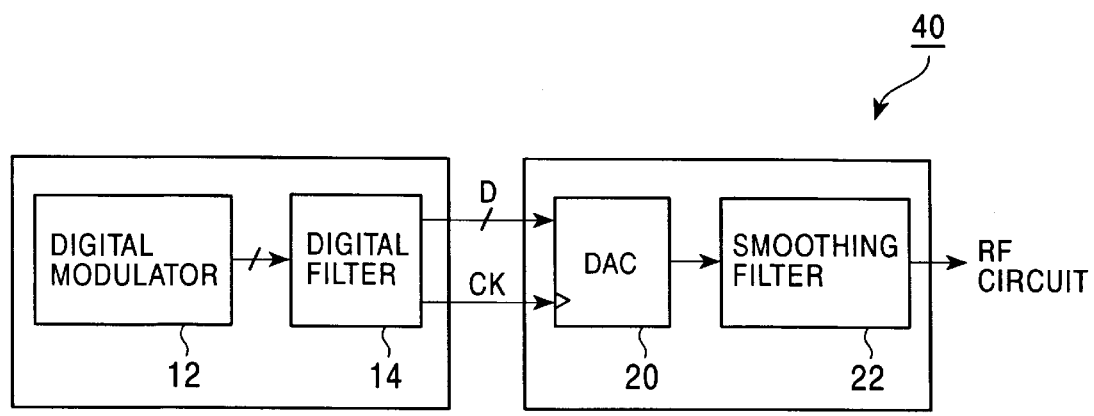
FIG. 11 is a conceptual block diagram of a conventional analog signal converter.

The analog signal converter 10 of the present invention shown in FIG. 1 differs from the conventional analog signal converter 40 shown in FIG. 11 by including the encoding circuit 16 and the decoding circuit 18. The same components as those in FIG. 11 are designated by the same reference numerals and a detailed explanation is omitted.

The encoding circuit 16 encodes signals output from the digital filter 14 according to a preset encoding method. The decoding circuit 18 decodes the encoded signals supplied through signal lines D according to a preset decoding method. The encoding and decoding methods are not limited. Conventionally well-known encoding and decoding methods can be used.

When the analog signal converter 10 shown in FIG. 1 is used in a mobile communication system for, for example, cellular phones, the digital modulator 12 modulates audio signals into signals in a frequency band used for radio communication. The digital filter 14 extracts signals in a predetermined frequency band. After that, the encoding circuit 16 sequentially encodes signals output in time series from the digital filter 14 according to the preset encoding method.

The signals encoded by the encoding circuit 16 are transferred to the decoding circuit 18 through the signal lines D. The decoding circuit 18 samples the encoded signals with sampling clock CK and sequentially decodes the signals according to the preset decoding method. The DAC 20 sequentially converts the signals decoded by the decoding circuit 18, the decoded signals being digital, into analog signals. The smoothing filter 22 filters the converted signals and then supplies the signals to an RF circuit.

In the analog signal converter 10 of the present invention, the encoding circuit 16 encodes digital signals output from the digital filter 14 so as to reduce the number of transition times of the signals. If the digital circuitry and the analog circuitry are arranged at a long distance from each other, as long as the encoded signals are transferred, power consumption can be reduced because the number of transition times of the signals is reduced. Since the number of transition times of encoded signals to be transferred is reduced, the effect of noises or interference between adjacent signal lines can be reduced.

The encoding and decoding methods will now be described hereinbelow with respect to a case where a difference between consecutive signals is obtained.

Figure 2:
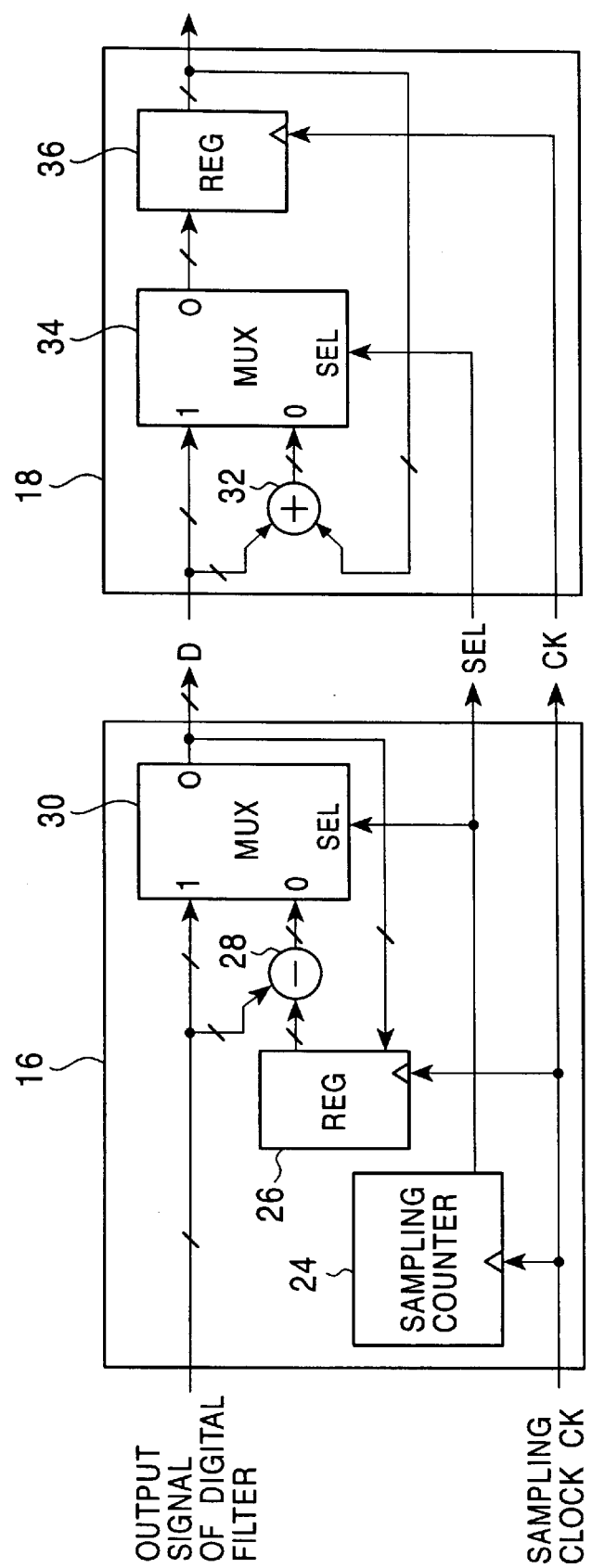
FIG. 2 is an exemplary block diagram showing an embodiment of an encoding circuit and a decoding circuit used in the analog signal converter according to the present embodiment.

FIG. 2 is an exemplary block diagram showing the present embodiment of the encoding circuit and the decoding circuit according to the present invention. The left part of FIG. 2 shows an example of the internal configuration of the encoding circuit 16 shown in FIG. 1. The encoding circuit uses an encoding method for generating an encoded signal including a difference between adjacent digital signals supplied in time series from the signal source. The right part of FIG. 2 shows an example of the internal configuration of the decoding circuit 18 shown in FIG. 1. The decoding circuit 18 uses a decoding method corresponding to the encoding method of the encoding circuit 16.

Referring to FIG. 2, the encoding circuit 16 includes a sampling counter 24, a register (REG) 26, a subtracter 28, and a multiplexer (MUX) 30.

The sampling clock CK is supplied to the sampling counter 24. Output signal SEL of the sampling counter 24 is supplied to a selection terminal SEL of the multiplexer 30. The sampling clock CK is supplied to a clock terminal of the register 26. Output signals of the digital filter 14 and output signals of the register 26 are supplied to the subtracter 28. The output signals of the digital filter 14 are supplied to an input terminal 1 of the multiplexer 30 and output signals of the substracter 28 are supplied to an input terminal 0 thereof. Output signals of the multiplexer 30 are output through the signal lines D and are also supplied to a data input terminal of the register 26.

The sampling counter 24 operates synchronously with the sampling clock CK so that the output signal SEL of the sampling counter 24 goes to a high level once every, for example, n samplings of the sampling clock CK and the output signal SEL is set to a low level for a period corresponding to (n−1) samplings of the sampling clock CK. The operation will now be described hereinbelow with respect to a case where the output signal SEL goes to the high level once every four samplings of the sampling clock and is set to the low level for a period corresponding to the other three samplings of the sampling clock.

At the time when the output signal SEL goes to the high level once every four samplings of the sampling clock CK, the multiplexer 30 outputs the output signal of the digital filter 14 as it is. For a period corresponding to the other three samplings during which the output signal SEL is set to the low level, the multiplexer 30 outputs the output signal of the subtracter 28, namely, the signal corresponding to a difference between the present output signal of the digital filter 14 and the preceding output signal of the multiplexer 30, the preceding output signal being stored in the register 26.

After that, the output signals of the multiplexer 30 are output through the signal lines D and are also stored in the register 26 synchronously with the sampling clock CK. Then, the above operation is repetitively performed.

The decoding circuit 18 includes an adder 32, a multiplexer (MUX) 34, and a register (REG) 36.

The output signals of the multiplexer 30 in the encoding circuit 16 and output signals of the register 36 are supplied to the adder 32. The output signals SEL of the sampling counter 24 in the encoding circuit 16 are supplied to a selection terminal SEL of the multiplexer 34. The output signals of the multiplexer 30 in the encoding circuit 16 are supplied to an input terminal 1 of the multiplexer 34. Output signals of the adder 32 are supplied to an output terminal 0 of the multiplexer 34. The sampling clock CK is supplied to a clock terminal of the register 36. Output signals of the multiplexer 34 are supplied to a data input terminal of the register 36. Output signals of the register 36 are supplied to the DAC 20 shown in FIG. 1.

In the decoding circuit 18, the multiplexer 34 operates in accordance with the output signals SEL of the sampling counter 24 in a manner similar to the multiplexer 30 in the encoding circuit 16. In other words, when the output signal SEL goes to the high level once every four samplings of the sampling clock CK, the multiplexer 34 outputs the output signal of the multiplexer 30 in the encoding circuit 16 as it is. For a period corresponding to the other three samplings of the sampling clock, the multiplexer 34 outputs the output signal of the adder 32, namely, the signal obtained by adding the present output signal of the multiplexer 30 in the encoding circuit 16 and the preceding output signal of the multiplexer 34, the preceding output signal being stored in the register 36.

After that, the output signals of the multiplexer 34 are stored in the register 36 synchronously with the sampling clock CK and are also supplied to the DAC 20 shown in FIG. 1. Then, the above operation is repetitively performed.

Signals to be transferred from the encoding circuit 16 to the decoding circuit 18 will now be described using specific numerical values.

For example, in the case of a cellular phone according to the W-CDMA system, the frequency components of signals are equal to 1.92 MHz (chip rate=3.84 MHz) or less. On the other hand, in many cases, a sampling frequency is set to 15.36 MHz (namely, four samplings correspond to one chip time) that is eight times as high as the above frequency, or 19.2 MHz that is 10 times as high as the above frequency. Pseudo random number data is spread with a predetermined code, spread signals are then sampled with a frequency that is eight times as high as the above signal frequency, the sampled signals are converted using the 10-bit DAC 20. This case will now be described hereinbelow.

FIG. 3 is an exemplary schematic diagram showing signals to be encoded (before encoding) and encoded signals (after encoding).

Referring to FIG. 3, 10-bit signals to be encoded, the signals serving as output signals (binary numbers) of the digital filter 14, decimal values representing the signals to be encoded, differential values (decimal numbers) between adjacent signals, and encoded signals serving as output signals (binary numbers) of the encoding circuit 16 are shown in this order from the left. In FIG. 3, each downward arrow denotes a transition part of the signal, namely, a part in which power is consumed due to transition.

For example, a first signal to be encoded represents "1101001011 (binary number)"="843 (decimal number)". According to the present embodiment, when the first signal is processed, the output signal SEL of the sampling counter 24 is set to the high level. Therefore, the first signal is transferred as it is to the decoding circuit 18.

A second signal to be encoded represents "1100110110 (binary number)"="822 (decimal number)". A difference between the first and second signals, representing "−21 (decimal number)"="1111101011 (binary number)", is transferred as an encoded signal to the decoding circuit 18. After that, similarly, a difference between the second and third signals to be encoded, representing "−64 (decimal number)"="1111000000 (binary number)", and a difference between the third and fourth signals to be encoded, representing "−92 (decimal number)"="1110100100 (binary number)", are sequentially transferred to the decoding circuit 18. In other words, the output signals SEL of the sampling counter 24 are set to the low level for this period.

Subsequently, the output signal SEL of the sampling counter 24 again becomes the high level. A fifth signal to be encoded, representing "1000111001 (binary number)"="569 (decimal number)", is transferred as it is to the decoding circuit 18. After that, the above operation is repetitively performed.

When the analog signal converter is used in the cellular phone as mentioned above, the number of transition times of each of respective bits of the signal lines D for one frame time (=10 mS=38400 chips) is measured. FIGS. 4A–B are tables showing results of the measurement. The table of FIG. 4A shows the number of transition times of each of respective bits Bit[9] to Bit[0] of the signal lines D when signals to be encoded are transferred. The table of FIG. 4B shows the number of transition times of each of respective bits Bit[9] to Bit[0] of the signal lines D when signals (differences) obtained by encoding the above signals are transferred.

When both the tables are compared, the number of transition times after encoding is larger than that before encoding in some bits. However, it is obviously understood that the total number of transition times of all the bits after encoding is smaller than that before encoding.

In this case, for the bit Bit[9], the number of transition times after encoding is remarkably larger than that before encoding. The reason is as follows: The bit Bit[9] represents a sign. The larger the number of inversion times of the sign of a signal serving as a difference, the larger the number of transition times. Therefore, it is preferable to properly adjust the sampling timing, the sampling frequency, and the number of clocks, every which the level of the output signal SEL of the sampling counter 24 varies, so as to reduce the number of inversion times of the sign of a signal serving as a difference.

The encoding and decoding methods will now be described with respect to a case where a difference between adjacent signals and a difference (second difference) of the adjacent differences is further obtained.

Figure 5:
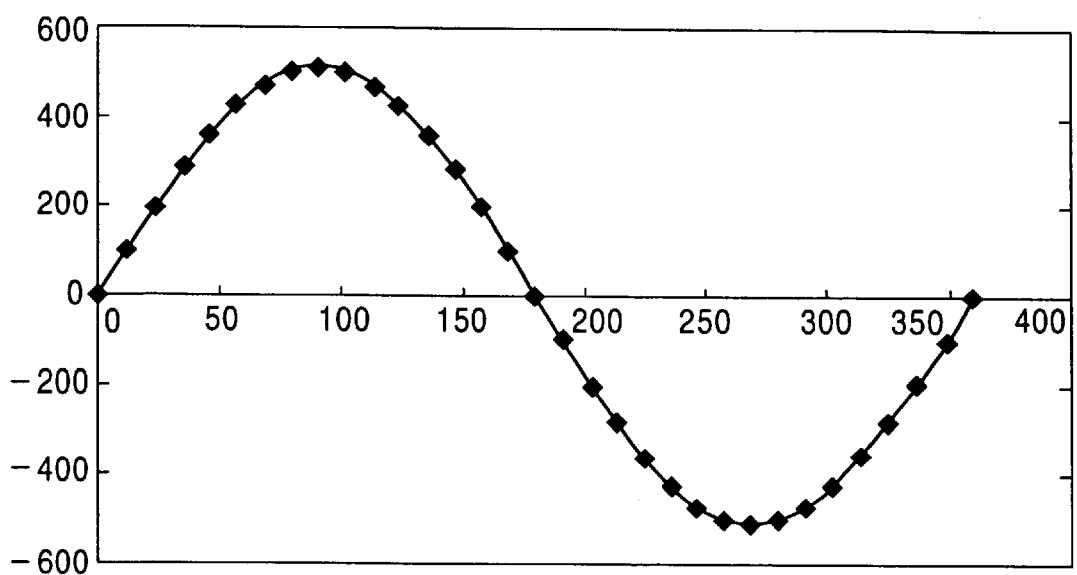
FIG. 5 is an exemplary graph showing signals to be encoded according to the present embodiment.

FIG. 5 is an exemplary graph showing signals to be encoded according to the present embodiment.

FIG. 5 shows the graph of a sine wave serving as signals to be encoded according to the present embodiment. The ordinate axis denotes a value of a signal and the abscissa axis denotes time. According to the present embodiment, it is assumed that data A, B, C, D, E, F, A', B', C', D', E', and F' obtained by sequentially sampling the sine wave at the times "♦" are sequentially transferred from the encoding circuit 16 to the decoding circuit 18 through the 10-bit signal lines D.

Each of the data A and A' is not encoded and is then transferred as it is. For the data B and B', each of a difference (B–A) and a difference (B'–A') is obtained and is then transferred. For the data C, D, E, F, C', D', E', and F', second differences (C–B)–(B–A), (D–C)–(C–B), (E–D)–(D–C), (F–E)–(E–D), (C'–B')–(B'–A'), (D'–C')–(C'–B'), (E'–D')–(D'–C'), and (F'–E')–(E'–D') are obtained and are then transferred.

In the encoding circuit 16, when the first data A is input, the data A is held serving as the present input (FIG. 6A). When the next data B is input, the data A is held serving as the first previous input and the data B is held serving as the present input (FIG. 6B). In the same way, the present to the third previous data are sequentially held. When the first input data A is held serving as the third previous input, the data A is transferred to the decoding circuit 18 (FIG. 6D).

Subsequently, when the third data C is input, the difference (B–A) is calculated and is then held serving as the present difference (FIG. 6C). When the data D is input, the difference (B–A) is held serving as the first previous difference and the difference (C–B) is held serving as the present difference (FIG. 6D). In the same way, the present to the second previous differential data are sequentially held. When the first differential data (B–A) is held serving as the second previous differential data, the differential data is transferred (FIG. 6E).

Subsequently, when the fifth data E is input, the second difference (C–B)–(B–A) is calculated and is then held serving as the present second difference (FIG. 6E). When the subsequent data F is input, the second difference (C–B)–(B–A) is held serving as the first previous second difference and the second difference (D–C)–(C–B) is held serving as the present second difference (FIG. 6F). In the same manner, the present second differential data and the first previous second differential data are sequentially held.

When the second difference (C–B)–(B–A) is held serving as the first previous second difference, the second difference is transferred (FIG. 6F). In the same way, each of the second differential data (D–C)–(C–B), (E–D)–(D–C), and (F–E)–(E–D) is transferred when it is held serving as the first previous second difference (FIGS. 6G, 6H, and 6I).

Similarly, the input data A' is transferred when it is held serving as the third previous input data (FIG. 6J). The differential data (B'–A') is transferred when it is held serving as the second previous differential data (FIG. 6K). The second differential data (C'–B')–(B'–A') is transferred when it is held serving as the first previous second differential data (FIG. 6L). The second differential data (D'–C')–(C'–B'), (E'–D')–(D'–C'), and (F'–E')–(E'–D') are sequentially transferred when each of them is held serving as the first previous second difference (not shown).

The decoding circuit 18 includes three holding circuits mem1 to mem3 (not shown). As shown in FIG. 7, when the decoding circuit 18 receives the first data A, namely, the data which is not encoded, all of the holding circuits mem1 to mem3 are cleared to zero (zero is stored as data in each of the holding circuits). The received data A is output serving as decoded data (after decoding) as it is (No. 1). After that, the decoded data A is stored in the holding circuit mem3 (No. 2).

In order to allow the decoding circuit 18 to recognize that received data is original data which is not encoded, the encoding and decoding methods can be predetermined. For example, when the encoding circuit 16 transfers data that is not encoded, the encoding circuit 16 transmits a signal such as the output signal SEL of the sampling counter 24 shown in FIG. 2, the signal indicating that the data is not encoded, or transfers data that is not encoded every several data to be transferred.

Subsequently, when the next data (B–A) is received by the decoding circuit 18, the data (B–A) is stored in the holding circuit mem1. Then, the data B (=(B–A)+0+A) serving as the addition result of the data stored in all of the holding circuits mem1 to mem3 is output serving as decoded data (No. 2). After that, the data (B–A)(=(B–A)+0) serving as the addition result of the data of the holding circuits mem1 and mem2 is stored in the holding circuit mem2. The decoded data B is stored in the holding circuit mem3 (No. 3).

In the same manner, the next data (C–B)–(B–A) is stored in the holding circuit mem1. The data C (=((C–B)–(B–A))+ (B–A)+B) serving as the addition result of the data of all the holding circuits mem1 to mem3 is output serving as decoded data (No. 3). After that, the data (C–B)(=((C–B)–(B–A))+ (B–A)) serving as the addition result of the data of the holding circuits mem1 and mem2 is stored in the holding circuit mem2 and the decoded data C is stored in the holding circuit mem3 (No. 4). The subsequent data is processed in the same manner.

Data input to the encoding circuit 16 will now be described using specific numerical values with reference to tables shown in FIGS. 8 and 9.

The table of FIG. 8 shows input data of the time "♦" on the top of the curve in the graph of FIG. 5 and those of the subsequent times "♦" in the order to the right. The table of FIG. 8 also shows differential data and second differential data which are calculated on the basis of the input data. In this table, "512" serving as input data (having a phase of 90°) and "0" serving as input data (having a phase of 180°) are not encoded and are then transferred as they are. The table of FIG. 9 shows the operation of the decoding circuit 18 when data shown in the table of FIG. 8 is used. It is understood from FIGS. 8 and 9 that the input data is decoded correctly.

FIG. 10 is an exemplary table showing the number of transition times of data (data to be encoded) sampled at the times "♦" in the graph of FIG. 5 and the number of transition times of data obtained by encoding the data. As shown in FIG. 10, when data is encoded (a second difference is obtained in the present embodiment), the number of transition times can be reduced to about 54% (=80/148). Consequently, power consumption can be reduced by the above reduction and the effect of noises or interference between adjacent transfer signals can be reduced.

In the present embodiment in which a second difference is obtained and is then transferred, the number of transition times of the most significant bit indicating the sign of data does not remarkably increase. The reason is that data is not encoded and is then transferred as it is at each time just before the time when the positive or negative of a difference is inverted. According to the present embodiment, for example, data, which is not encoded, is transferred as it is at each time "♦" when the phase of the sine wave is set to 0°, 90°, 180°, or 270°. It results in a very effective reduction in the number of transition times.

In the conceptual diagram shown in FIG. 1, the digital circuitry on the left includes the digital modulator 12 and the digital filter 14 and the analog circuitry on the right includes the DAC 20 and the smoothing filter 22. The present invention is not limited to the above arrangement. If digital circuitry performs various digital processes to a signal, any digital circuitry can be used serving as a signal source. Any analog circuitry including at least a DAC similar to the DAC 20 can be used. The above circuitry can include a component other than the circuits shown in the diagram.

The analog signal converter according to the present invention is fundamentally constructed as mentioned above.

The analog signal converter of the present invention has been described in detail. The present invention is not limited to the above embodiment. Variations and modifications are possible within the spirit and scope of the appended claims.

As explained above in detail, in the analog signal converter according to the present invention, the encoding circuit sequentially encodes digital signals supplied in time series and then transfers the encoded signals. Subsequently, the decoding circuit sequentially receives the encoded digital signals and decodes the signals. The digital-analog converter sequentially converts the decoded digital signals into analog signals.

As mentioned above, according to the analog signal converter of the present invention, data is encoded and is then transferred from the digital circuitry to the analog circuitry, resulting in a reduction in the number of transition times of data to be transferred. Thus, power consumption can be reduced by the above reduction. The effect of noises or interference between adjacent transfer signals can also be reduced.

What is claimed is:

1. An analog signal converter comprising:
   an encoding circuit that sequentially encodes digital signals supplied in time series;
   a decoding circuit that sequentially decodes the digital signals encoded by the encoding circuit; and
   a digital-analog converter that sequentially converts the digital signals decoded by the decoding circuit into analog signals,
   wherein the encoding circuit obtains a difference between adjacent digital signals supplied in time series and further obtains a difference between the differences.

2. An analog signal converter comprising:
   an encoding circuit that sequentially encodes digital signals supplied in time series;
   a decoding circuit that sequentially decodes the digital signals encoded by the encoding circuit; and
   a digital-analog converter that sequentially converts the digital signals decoded by the decoding circuit into analog signals,
   wherein the encoding circuit obtains a difference between adjacent digital signals supplied in time series, further the encoding circuit does not encode one digital signal of the digital signals supplied in time series every predetermined number of digital signals and outputs the digital signal as is.

3. An analog signal converter comprising:
   an encoding circuit that sequentially encodes digital signals supplied in time series;
   a decoding circuit that sequentially decodes the digital signals encoded by the encoding circuit; and
   a digital-analog converter that sequentially converts the digital signals decoded by the decoding circuit into analog signals,
   wherein the encoding circuit obtains a difference between adjacent digital signals supplied in time series, at a time just prior to a positive or negative of the difference being inverted, the encoding circuit does not encode a digital signal of the digital signals supplied in time series and outputs the digital signal as is.

4. An analog signal converter for converting digital signals into analog signals, the analog signal converter including digital circuitry and analog circuitry, comprising:
   a digital modulator that modulates digital signals into modulated digital signals in a predetermined frequency band used in communication;
   a digital filter that extracts filtered digital signals in the predetermined frequency band from the modulated digital signals;
   an encoding circuit that sequentially encodes the filtered digital signals output from the digital filter;
   a decoding circuit that sequentially decodes the encoded digital signals; and
   a digital-analog converter that sequentially converts the decoded digital signals into analog signals,
   wherein the encoding circuit performs encoding by using a sampling clock and/or a clock synchronous to the sampling clock, so as to sample the decoded digital signals in the digital-analog converter.

5. An analog signal converter for converting digital signals into analog signals, the analog signal converter including digital circuitry and analog circuitry, comprising:
   a digital modulator that modulates digital signals into modulated digital signals in a predetermined frequency band used in communication;
   a digital filter that extracts filtered digital signals in the predetermined frequency band from the modulated digital signals;
   an encoding circuit that sequentially encodes the filtered digital signals output from the digital filter;
   a decoding circuit that sequentially decodes the encoded digital signals; and
   a digital-analog converter that sequentially converts the decoded digital signals into analog signals,
   wherein the decoding circuit performs decoding by using a sampling clock and/or a clock synchronous to the sampling clock, so as to sample the decoded digital signals in the digital-analog converter.

* * * * *